(12) United States Patent
Frank

(10) Patent No.: US 11,257,630 B2
(45) Date of Patent: Feb. 22, 2022

(54) PRIMARY NANOPARTICLE FABRICATION

(71) Applicant: Blue Horizons Innovations, LLC, Coconut Creek, FL (US)

(72) Inventor: David L. Frank, Highland Beach, FL (US)

(73) Assignee: Blue Horizons Innovations, LLC, Coconut Creek, FL (US)

( * ) Notice: Subject to any disclaimer, the term of this patent is extended or adjusted under 35 U.S.C. 154(b) by 0 days.

(21) Appl. No.: 17/101,001

(22) Filed: Nov. 23, 2020

(65) Prior Publication Data

US 2021/0142958 A1     May 13, 2021

Related U.S. Application Data

(60) Continuation-in-part of application No. 16/824,364, filed on Mar. 19, 2020, now Pat. No. 10,961,158, and (Continued)

(51) Int. Cl.
*H01G 11/12*     (2013.01)
*H01G 11/72*     (2013.01)
(Continued)

(52) U.S. Cl.
CPC .......... *H01G 11/12* (2013.01); *C01G 23/002* (2013.01); *C01G 23/006* (2013.01);
(Continued)

(58) Field of Classification Search
CPC ..... C04B 35/465; C04B 35/622; H01G 11/12; H01G 4/0085; H01G 4/12; H01G 4/1227;
(Continued)

(56) References Cited

U.S. PATENT DOCUMENTS

| 5,470,583 A | 11/1995 | Na et al. |
| 8,512,675 B2 | 8/2013 | Lee et al. |

(Continued)

OTHER PUBLICATIONS

International Search Report dated Mar. 26, 2021 issued for International Application No. PCT/US20/61726 dated Mar. 26, 2021.
(Continued)

*Primary Examiner* — Alex B Efta
(74) *Attorney, Agent, or Firm* — Fleit Intellectual Property Law; Jose Gutman

(57) ABSTRACT

According to a novel fabrication method, a new composition of matter includes a large percentage (e.g., 75% or higher percentage) of primary nanoparticles in the new composition of matter. The novel fabrication method reduces the size of nanoparticle clusters in material of the new composition of matter, allows fabrication of specific nanoparticle cluster sizes, and allows fabrication of primary nanoparticles. This new composition of matter can include a high permittivity and high resistivity dielectric compound. This new composition of matter, according to certain examples, has high permittivity, high resistivity, and low leakage current. In certain examples, the new composition of matter constitutes a dielectric energy storage device that is a battery with very high energy density, high operating voltage per cell, and an extended battery life cycle.

16 Claims, 9 Drawing Sheets

Related U.S. Application Data a continuation-in-part of application No. 16/453,722, filed on Jun. 26, 2019, now Pat. No. 10,847,325, which is a division of application No. 15/660,613, filed on Jul. 26, 2017, now Pat. No. 10,347,433, which is a continuation-in-part of application No. 15/168,042, filed on May 28, 2016, now Pat. No. 10,269,493, which is a continuation-in-part of application No. 14/903,040, filed as application No. PCT/US2014/043416 on Jun. 20, 2014, now Pat. No. 9,899,154.

(60) Provisional application No. 63/081,523, filed on Sep. 22, 2020, provisional application No. 63/069,113, filed on Aug. 23, 2020, provisional application No. 63/056,662, filed on Jul. 26, 2020, provisional application No. 62/958,799, filed on Jan. 9, 2020, provisional application No. 62/942,154, filed on Dec. 1, 2019, provisional application No. 62/916,308, filed on Oct. 17, 2019, provisional application No. 62/912,420, filed on Oct. 8, 2019, provisional application No. 62/891,306, filed on Aug. 24, 2019, provisional application No. 62/859,739, filed on Jun. 11, 2019, provisional application No. 62/836,812, filed on Apr. 22, 2019, provisional application No. 62/820,971, filed on Mar. 20, 2019, provisional application No. 62/514,627, filed on Jun. 2, 2017, provisional application No. 62/462,490, filed on Feb. 23, 2017, provisional application No. 62/446,763, filed on Jan. 16, 2017, provisional application No. 62/394,247, filed on Sep. 14, 2016, provisional application No. 62/323,647, filed on Apr. 16, 2016, provisional application No. 62/297,982, filed on Feb. 22, 2016, provisional application No. 62/293,910, filed on Feb. 11, 2016, provisional application No. 62/289,283, filed on Jan. 31, 2016, provisional application No. 62/277,598, filed on Jan. 12, 2016, provisional application No. 62/271,923, filed on Dec. 28, 2015, provisional application No. 62/271,996, filed on Dec. 28, 2015, provisional application No. 62/174,004, filed on Jun. 11, 2015, provisional application No. 62/168,768, filed on May 30, 2015, provisional application No. 61/983,407, filed on Apr. 23, 2014, provisional application No. 61/931,754, filed on Jan. 27, 2014, provisional application No. 61/910,921, filed on Dec. 2, 2013, provisional application No. 61/893,832, filed on Oct. 21, 2013, provisional application No. 61/875,076, filed on Sep. 8, 2013, provisional application No. 61/863,032, filed on Aug. 7, 2013, provisional application No. 61/863,042, filed on Aug. 7, 2013, provisional application No. 61/862,210, filed on Aug. 5, 2013, provisional application No. 61/958,330, filed on Jul. 25, 2013, provisional application No. 61/958,169, filed on Jul. 22, 2013, provisional application No. 61/957,517, filed on Jul. 6, 2013.

(51) Int. Cl.
| | |
|---|---|
| *H01G 4/008* | (2006.01) |
| *H01G 4/12* | (2006.01) |
| *H01G 4/30* | (2006.01) |
| *C01G 23/00* | (2006.01) |
| *H01M 50/116* | (2021.01) |
| *H01L 49/02* | (2006.01) |
| *H01G 4/38* | (2006.01) |
| *H01G 4/232* | (2006.01) |

(52) U.S. Cl.
CPC ............ *H01G 4/0085* (2013.01); *H01G 4/12* (2013.01); *H01G 4/1227* (2013.01); *H01G 4/30* (2013.01); *H01G 11/72* (2013.01); *H01L 28/40* (2013.01); *H01L 28/55* (2013.01); *H01M 50/116* (2021.01); *C01P 2002/34* (2013.01); *C01P 2004/00* (2013.01); *C01P 2004/64* (2013.01); *H01G 4/1218* (2013.01); *H01G 4/1281* (2013.01); *H01G 4/232* (2013.01); *H01G 4/38* (2013.01); *H01M 2220/30* (2013.01); *Y02E 60/10* (2013.01); *Y02T 10/70* (2013.01)

(58) Field of Classification Search
CPC . H01G 4/30; H01G 4/38; H01L 28/40; H01L 28/55; C01G 23/002; C01G 23/006; C01G 2002/34; C01G 2004/00; C01G 2002/64
See application file for complete search history.

(56) References Cited

U.S. PATENT DOCUMENTS

| | | | |
|---|---|---|---|
| 9,248,501 B1 | 2/2016 | Johannes et al. | |
| 2006/0083694 A1* | 4/2006 | Kodas | ................. B01J 13/0043 424/46 |
| 2014/0022694 A1* | 1/2014 | Reynolds | ................. H01G 4/12 361/301.4 |
| 2017/0324057 A1 | 11/2017 | Friend et al. | |

OTHER PUBLICATIONS

Written Opinion of the International Security Authority dated May 26, 2021.

\* cited by examiner

PRIMARY NANOPARTICLE FABRICATION

BACKGROUND

The present disclosure generally relates to fabrication of primary nanoparticles for use in a wide variety of devices and applications. Primary nanoparticles (also referred to as Primary Particles) typically include one or more very fine nanoparticles and/or a small cluster of very fine nanoparticles. Each primary nanoparticle typically measures less than or equal to approximately 20 nm in a critical dimension of each such primary nanoparticle. Current nanoparticle fabrication methods lead to fabrication of agglomerated nanoparticles (e.g., a group of primary nanoparticles) that are each larger, when measured in a critical dimension of the agglomerated nanoparticle, than a primary nanoparticle, when measured in a critical dimension of the primary nanoparticle. These agglomerated nanoparticles are typically not separable using conventional fabrication methods. These agglomerated nanoparticles accordingly restrict the ability to maintain primary nanoparticles in a particular material volume.

One example application of nanoparticles is in fabrication of devices and systems for energy storage and energy generation. Agglomerated nanoparticles in this example application fail to offer a full performance of primary nanoparticles. Many such devices and applications demand high energy density, high operating voltage per cell, and an extended battery life cycle. Agglomerated nanoparticles adversely affect energy storage capabilities, and other operational parameters, of these devices and applications.

Therefore a need exists to overcome the problems with the prior art as discussed above.

BRIEF SUMMARY

The present disclosure generally relates to a new method of fabrication of material including primary nanoparticles that, according to various embodiments, the new method uses a controlled calcination temperature, an acid wash approach, and a surfactant.

Nanoparticles are important to a wide variety of new devices and new applications. A primary nanoparticle includes one or more very fine nanoparticles, which can include either one or more individual very fine nanoparticles or a small cluster of very fine nanoparticles, which typically measures less than or equal to approximately 20 nm in a critical dimension of each such primary nanoparticle.

When forming very fine nanoparticles using conventional fabrication methods there is a high probability that the very fine nanoparticles will group together (agglomerate) to form one or more agglomerated nanoparticles. Each such agglomerated nanoparticle measures, in a critical dimension of such agglomerated nanoparticle, a much greater size than the size measured for a primary nanoparticle (i.e., the size of an agglomerated nanoparticle can be >>20 nm in a critical dimension of each such agglomerated nanoparticle). For example, such agglomerated nanoparticle may measure greater than 50 nanometers, and more commonly greater than 100 nanometers or greater than 500 nanometers, or even greater, in a critical dimension of such agglomerated nanoparticle. This agglomeration of nanoparticles can occur very quickly when primary nanoparticles are physically in close proximity to each other. Additionally, agglomerated nanoparticles can quickly become very hard and difficult to separate into individual primary nanoparticles. These agglomerated nanoparticles are not separable using conventional fabrication methods. Such formation of agglomerated nanoparticles restricts the ability to form a material that includes a large percentage (e.g., 75% or higher percentage) of primary nanoparticles in a defined volume of the material.

New technologies for energy storage and energy generation can utilize very fine nanoparticles in a matrix. These very fine nanoparticles have higher surface area and higher energy. High surface area to volume ratio of nanoparticles provides a very high surface energy. Very fine nanoparticles tend to agglomerate to form agglomerated nanoparticles and accordingly reduce or minimize the surface energy of the agglomerated nanoparticles. Uncontrolled agglomeration of nanoparticles can occur from, for example, attractive Van der Waals forces between the nanoparticles in close proximity to each other. The Van der Waals attraction and agglomeration can occur very quickly as synthesized nanoparticles begin to cool from a heated state. In the heated state, these nanoparticles can form bonds resulting in hard agglomerate (e.g., agglomerated nanoparticles) that conventional fabrication methods fail to disrupt and separate into primary nanoparticles.

This naturally occurring agglomeration of nanoparticles reduces the ability to create discrete very fine nanoparticles, and is especially prevalent in oxide particles. Standard processes, such as sonification, ball milling, and microfluidics, are not effective at reducing these nanoparticle agglomerates (or agglomerated nanoparticles).

According to various embodiments, a modified internal barrier layer capacitor material comprises: a base material comprising unmodified internal barrier layer capacitor material having grain boundaries; one or more resistive materials bonded to the grain boundaries of the base material to form modified grain boundaries of the base material, wherein a first resistive material of the one or more resistive materials is bonded to grain boundaries of the unmodified internal barrier layer capacitor material forming a modified internal barrier layer capacitor material which includes nanoparticles of the one or more resistive materials added to nanoparticles of the unmodified internal barrier capacitor material; and an amorphous region in between the grain boundaries of the modified internal barrier layer capacitor material, the amorphous region including nanoparticles of the one or more resistive materials, and wherein at least one of the base material and the one or more resistive materials, comprises at least 75% or higher percentage of primary nanoparticles in the respective at least one of the base material and the one or more resistive materials.

According to various embodiments, a modified internal barrier layer capacitor material comprises a base material comprising unmodified internal barrier capacitor material having grain boundaries; a first resistive material bonded to grain boundaries of the base material, and a second resistive material bonded to grain boundaries of the base material, to form modified grain boundaries of the base material. The first resistive material is bonded to grain boundaries of the base unmodified internal barrier capacitor material forming a grain boundary composition including nanoparticles of the first resistive material added to nanoparticles of the unmodified internal barrier capacitor material. The second resistive material is bonded to grain boundaries of the grain boundary composition, and forms a modified internal barrier layer capacitor material including nanoparticles of the second resistive material added to nanoparticles of the grain boundary composition. An amorphous region, in between the grain boundaries of the modified internal barrier layer capacitor material, includes nanoparticles of at least one of the first and second resistive materials. At least one of the base material, the first resistive material, or the second resistive material, comprises at least 75% or higher percentage of primary nanoparticles in the respective at least one of the base material, the first resistive material, or the second resistive material.

According to various embodiments, material of at least one of the base material, the first resistive material, or the second resistive material, comprises at least 95% or higher percentage of primary nanoparticles.

According to certain embodiments, material of at least one of the base material, the first resistive material, or the second resistive material, comprises 99% or higher percentage of primary nanoparticles in the respective base material, the first resistive material, or the second resistive material.

According to various embodiments, the modified internal barrier layer capacitor material has a dielectric permittivity of at least 50,000; a resistivity of at least $10^{12}$ ohms/centimeter; and a dielectric strength of at least 50 volts per micron of thickness.

a) According to various embodiments, a reduction of nanoparticle grouping (e.g., including one or more agglomerated nanoparticles and/or aggregated nanoparticles) in a fabrication process, comprises:

Subjecting one or more calcine heated nanoparticle groupings (e.g., material including one or more agglomerated nanoparticles and/or aggregated nanoparticles) to a dissolving pH solution, where the pH of the dissolving pH solution is adjusted to dissolve nanoparticle interconnections at interfaces of a plurality of nanoparticles in the one or more nanoparticle groupings;

Agitation of the plurality of nanoparticles in the dissolving pH solution;

Separating the plurality of nanoparticles from the dissolving pH solution;

Placing the plurality of nanoparticles in a pH matching solution, where the pH of the pH matching solution is adjusted to match the iso-electric point of the plurality of nanoparticles, to remove the dissolving pH solution;

Adding a surfactant to the pH matching solution with the plurality of nanoparticles to separate the plurality of nanoparticles, coat with the surfactant the separated plurality of nanoparticles, and maintain nanoparticle separation in the separated plurality of nanoparticles; and Agitation of the plurality of nanoparticles and surfactant in the pH matching solution to yield at least one of clustered nanoparticles or primary nanoparticles.

The fabrication process described above in a), where the nanoparticle grouping, that is subjected to the dissolving pH solution, includes at least one of a nanoparticle agglomerate, a nanoparticle aggregate, or a cluster of nanoparticles.

The fabrication process described in the example above in a), where the dissolving pH solution is comprised of a liquid with a pH of between −2.0 to 12.0 to dissolve the nanoparticle interconnections.

The fabrication process described in the example above in a), where the dissolving pH solution is comprised of ethanol with a pH of between −2.0 to 12.0 to dissolve the nanoparticle interconnections.

The fabrication process described in the example above in a), where the dissolving pH solution is comprised of distilled water with a pH of between −2.0 to 12.0 to dissolve the nanoparticle interconnections.

The fabrication process described in the example above in a), where the dissolving pH solution is comprised of a liquid with a pH of between −2.0 to 12.0 to dissolve the particle interconnections and a surfactant to coat the separated plurality of nanoparticles.

The fabrication process described in the example above in a), where the agitation can be performed by a wide variety of processes including one or more of stirring, ball milling, bead milling, sonification, or jet microfluidics.

The fabrication process described in the example above in a), where calcine heated surfaces of nanoparticles in the nanoparticle grouping become soft and form a hard interconnection, when cooled, between the nanoparticles at interfacial contacts between adjacent nanoparticles.

The fabrication process described in the example above in a), where the nanoparticle grouping, that is subjected to the dissolving pH solution, comprises a Van der Waals formation of nanoparticles.

The fabrication process described in the example above in a), where the nanoparticle grouping includes one or more agglomerated nanoparticles and/or aggregated nanoparticles, formed as an ionic bond between oxygen atoms of adjacent nanoparticles.

The fabrication process described in the example above in a), where the nanoparticle grouping includes one or more agglomerated nanoparticles and/or aggregated nanoparticles, formed as a covalent bond between metal and non-metal atoms of adjacent nanoparticles.

The fabrication process described in the example above in a), where the nanoparticle grouping includes one or more agglomerated nanoparticles and/or aggregated nanoparticles, formed as a metallic bond between atoms of adjacent nanoparticles.

The fabrication process described in the example above in a), where the nanoparticle grouping includes one or more agglomerated nanoparticles and/or aggregated nanoparticles, formed from one or more of the following bond types: Van der Waals, ionic, covalent, or metallic.

The fabrication process described in the example above in a), where the nanoparticle grouping is reduced to material that comprises at least 75% or higher percentage of primary nanoparticles in the respective material.

The fabrication process described in the example above in a), where the nanoparticle grouping is reduced to material that comprises at least 95% or higher percentage of primary nanoparticles.

The fabrication process described in the example above in a), where the nanoparticle grouping is reduced to material that comprises at least 99% or higher percentage of primary nanoparticles in the respective material.

The fabrication process described in the example above in a), where an agglomeration of nanoparticles is reduced to nanoparticle clusters of primary nanoparticles. For example, and not for limitation, the agglomeration of nanoparticles can be reduced to nanoparticle clusters of ten nanoparticles or less. As another example, and not for limitation, the agglomeration of nanoparticles can be reduced to nanoparticle clusters of one hundred nanoparticles or less.

The fabrication process described in the example above in a), where an agglomeration of nanoparticles is reduced to nanoparticle clusters of one hundred (100) or less individual primary particles.

The fabrication process described in the example above in a), where the plurality of nanoparticles includes perovskite materials. According to certain embodiments, the plurality of nanoparticles includes at least one primary nanoparticle that comprises perovskite material.

The fabrication process described in the example above in a), where the plurality of nanoparticles includes perovskite materials applied in a dielectric energy storage material.

The fabrication process described in the example above in a), where the plurality of nanoparticles includes perovskite material in a matrix composed of reduced one or more nanoparticle groupings. According to certain embodiments, the matrix includes embedded nanoparticles that are reduced, according to the fabrication process described above in a), to material that comprises at least 75% or higher percentage of primary nanoparticles in the respective material. According to various embodiments of the fabrication process described above in a), the plurality of nanoparticles includes material embedded in a matrix that includes embedded nanoparticles of perovskite nanoparticles. According to various embodiments of the fabrication process described above in a), the plurality of nanoparticles includes material embedded in a matrix that includes embedded nanoparticles of calcium copper titanate (CCTO) embedded in $SiO_2$ to form a matrix. In certain embodiments, the matrix is applied in a capacitor device. In certain embodiments, the matrix is applied in a Dense Energy Ultra-Cell energy storage device. In certain embodiments, the matrix is applied in a photovoltaic energy generation device.

b) According to various embodiments of the fabrication process described above in a), the plurality of nanoparticles comprises material embedded in a matrix that includes modified internal barrier layer capacitor material for a dielectric energy storage layer, and which further comprises: an unmodified internal barrier layer capacitor (IBLC) material comprised of at least one of clustered nanoparticles or primary nanoparticles that are less than 50 nm in diameter (or measured less than 50 nm in a critical dimension of each of the clustered nanoparticles or primary nanoparticles).

c) According to various embodiments of the fabrication process described in the example above in b), nanoparticles of a first resistive material are bonded to grain boundaries of the unmodified IBLC material thereby resulting in a modified grain boundary composition.

d) According to various embodiments of the fabrication process described in the example above in c), nanoparticles of a second resistive material are bonded to the modified grain boundary composition thereby resulting in a modified internal barrier layer capacitor material.

e) According to various embodiments of the fabrication process described in the example above in d), a second resistive material is applied as a suspension resulting in the modified internal barrier layer capacitor material having grain boundary suspended in a resistive matrix.

f) According to various embodiments of the fabrication process described in the example above in e), the modified internal barrier layer capacitor material and matrix result in an integrated grain boundary region. Where, in certain embodiments, the modified internal barrier layer capacitor material, when equally distributed in the second resistive material and a resistive dielectric matrix, exhibits higher dielectric characteristics than dielectric nanoparticles greater than 50 nm and which are distributed in a matrix. Where, in certain embodiments, said resistive dielectric matrix is applied as the dielectric energy storage layer in a multilayer ceramic capacitor. Where, in various embodiments, said multilayer ceramic capacitor comprises an energy storage device.

g) The fabrication process described in the example above in a), where the plurality of nanoparticles are comprised of nanoparticles including a bond between two lithium atoms ($Li_2$) with one or more additives including a metal oxide or metal phosphate or metal sulfide that comprise the core of a core shell particle for application as a lithium-ion battery electrode composition. According to certain embodiments, the lithium-ion battery electrode composition comprises a composite core material that is reduced to a particle size of between 1 nanometer and 0.5 micron.

According to certain embodiments, the lithium-ion battery electrode composition described in the example above in g) comprises oxide additives that are porous. According to various embodiments, the lithium-ion battery electrode composition described in the example above in g), includes a shell of a core-shell composite comprising conductive carbon. According to various embodiments, an electrode comprises the lithium-ion battery electrode composition described in g), wherein an overall thickness of the electrode is larger than about 60 microns.

A challenge for lithium iron phosphate $LiFePO_4$ (LFP) batteries is that they have a much lower energy density than lithium nickel manganese cobalt oxide (NMC) batteries and lithium nickel cobalt aluminum oxide (NCA) batteries. The original LFP technology only had a 90 to 120 Wh/kg battery density. Recent reduction from LFP micron particles to around 200 nm LFP nanoparticles reached capacities of 160 Wh/kg. For comparison the Tesla NMC 2170 cells made by Panasonic are somewhere around 247 Wh/kg.

The inventor has discovered that an embodiment of the current invention allows LFP particle reduction from around 100 nm down to around 5 nm which further enhances LFP battery production. An embodiment of the current invention can include one or more specific particle sizes. According to an embodiment of the current invention, a cathode active material in a solid state battery comprises cathode active particles with particle sizes down to 5 nm.

h) A fabrication process according to an embodiment of the current invention, provides for lithium iron phosphate ($LiFePO_4$) applied as a cathode material in a lithium iron phosphate battery, and in certain embodiments wherein the cathode material particle size is reduced to between around 1 nm to around 0.5 microns.

The cathode material, according to an embodiment of the fabrication process described in the example above in h), wherein the reduction of particle size of the $LiFePO_4$ particles creates reduced pore diameter (or measured in a critical dimension of a pore) in the cathode material thereby increasing overall cathode surface area while reducing cathode material particle size to between around 1 nm to around 0.5 microns. The cathode material with reduced particle size provides increased energy density for the $LiFePO_4$ batteries based on an increased cathode surface area resulting in an increased reaction rate, shorter diffusion lengths, and a raised operational voltage. The cathode material with reduced particle size provides increased cathode conductivity raising the $LiFePO_4$ battery operating voltage from 3.2 volts to between 3.5 volts to 4.2 volts. The cathode material with reduced particle size also provides increased cathode conductivity allowing for more rapid charge times and an increased number of charge cycles.

The ability to create smaller particle sizes is highly desirable in the battery industry, but attempts to create smaller particle sizes encounters serious challenges and drawbacks using conventional fabrication methods. Smaller particle sizes also enable improved charge time, extended run time, and improved power, for a battery.

Various embodiments of the present invention provide a process to enable the production of discrete primary particles and/or to reduce the size of the nanoparticle agglomerates, and to yield a percentage of primary particles in a volume of material that includes at least 75% or higher percentage of primary nanoparticles in the respective material. In certain embodiments, the volume of material includes at least 95% or higher percentage of primary nanoparticles in the respective material. In certain embodiments, the volume of material includes at least 99% or higher percentage of primary nanoparticles in the respective material.

By reducing the size of the nanoparticle agglomerates, and accordingly increasing a percentage of primary particles, in a volume of material, a wide variety of improved devices and applications provide enhanced performance. Energy storage devices are of particular interest. For example, the reduction of lithium-based oxide particles in an energy storage device enable high surface area within an electrode and result in an increased energy density, increased operational voltage, more rapid charging and an increase in recharge cycles without substantial battery degradation. Additionally, the reduction of size of dielectric oxide particles suspended in a resistive matrix of a dielectric energy storage layer of an energy storage device, for example of a capacitor device and/or of an energy storage device, improves capacitance, resistivity, breakdown voltage, and overall performance parameters of the device.

BRIEF DESCRIPTION OF THE DRAWINGS

The accompanying figures in which like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
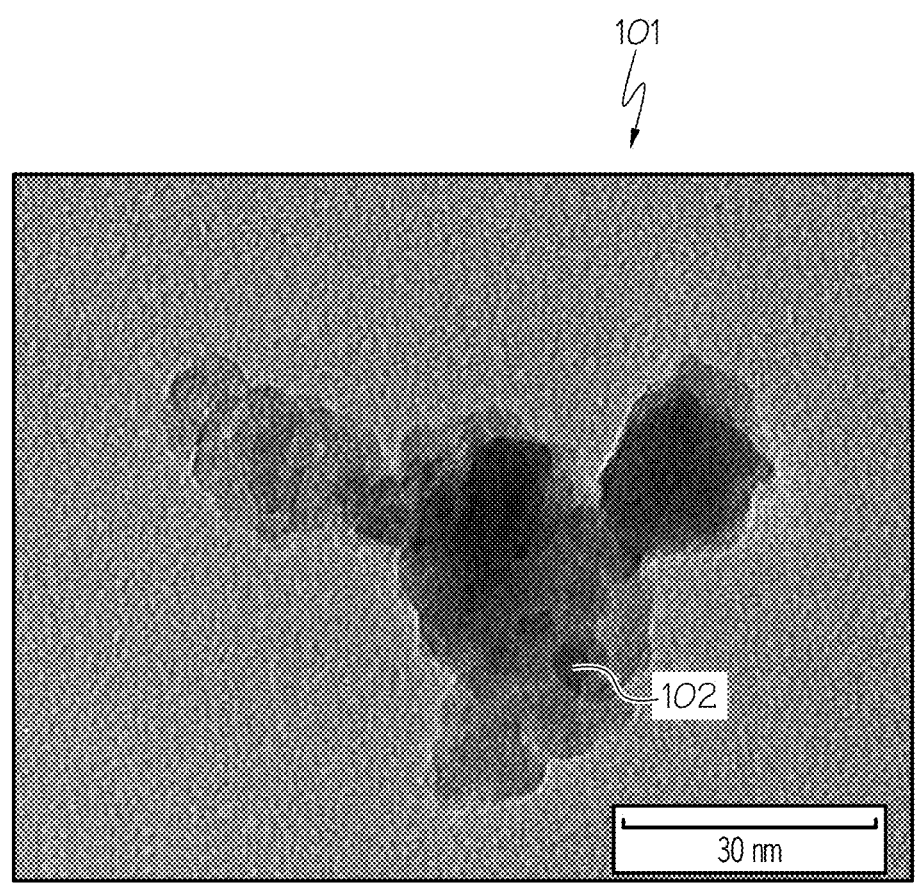
FIG. 1 is an illustration of an example of a single grain (e.g., a primary nanoparticle) connected to an agglomerated nanoparticle, in a material volume of an Internal Barrier Layer Capacitor (IBLC) Material.

As required, detailed embodiments are disclosed herein; however, it is to be understood that the disclosed embodiments are merely examples and that the devices, systems and methods described herein can be embodied in various forms. Therefore, specific structural and functional details disclosed herein are not to be interpreted as limiting, but merely as a basis for the claims and as a representative basis for teaching one of ordinary skill in the art to variously employ the disclosed subject matter in virtually any proprietary detailed structure and function. Further, the terms and phrases used herein are not intended to be limiting, but rather, to provide an understandable description. Additionally, unless otherwise specifically expressed or clearly understood from the context of use, a term as used herein describes the singular and/or the plural of that term.

The terms "a" or "an", as used herein, are defined as one or more than one. The term "plurality", as used herein, is defined as two or more than two. The term "another", as used herein, is defined as at least a second or more. The terms "including" and "having," as used herein, are defined as comprising i.e., open language. The term "coupled," as used herein, is defined as "connected," although not necessarily directly, and not necessarily mechanically.

The present disclosure generally relates to a new fabrication method for fabricating a new composition of matter that includes a greater than 75% percentage of primary particles in the respective material. More specifically, a new compound, for example, includes two or more highly resistive materials that are integrated into a chemistry of a grain boundary of an internal barrier layer capacitor material including a greater than 75% percentage of primary particles in the respective material. This new composition of matter results, for example, in a high permittivity of a dielectric compound, a high resistivity of the dielectric compound, and a low leakage current and high breakdown voltage of the dielectric compound, thereby enabling a highly efficient energy storage dielectric material.

In one example, a new compound is formed by a sequential addition of two or more highly resistive materials that increase an internal barrier layer capacitor material resistivity and therefore increase the ability to apply a strong voltage across the internal barrier layer capacitor material. The inventor has discovered that by adding multiple resistive materials to calcium copper titanium oxide (CCTO) in a specific sequence it modifies the chemistry of the CCTO outer grain boundary. When certain resistive materials are added in the correct sequence and correct methods, the permittivity, resistivity and breakdown voltage can be optimized. Additionally, the inventor has discovered that by applying a novel fabrication method to one or more materials (typically oxide materials) for adding into the internal barrier layer capacitor material a new compound is formed comprising an internal barrier layer capacitor material including a greater than 75% percentage of primary particles in the respective material. This novel fabrication method, for example, results in a highly efficient energy storage dielectric material.

The small size of very fine nanoparticles (e.g., primary particles) allows them to have unique characteristics that may not be possible on a macro-scale.

The terms "agglomerate" and "aggregate" are widely used by powder technologists to describe assemblages of particles that are found in dry powders and powders in liquid suspensions. Each term has a specific meaning. According to one example embodiment, the present disclosure uses the term agglomerate for the assembly of nanoparticles in a powder, typically derived from Van der Waals force where nanoparticles closely packed form electrical connections with each other. The inventor has discovered that this type of agglomeration can be broken apart by agitating the nanoparticles in a liquid.

According to an embodiment of the present invention, the term aggregate for nanoparticle agglomeration can lead to the formation of nanomaterial compounds including nanocrystals as heat-treated materials for hard connections.

Example of Chemical Bonds in Nanotechnology

Material properties in micro and nano dimensions differ dramatically from bulk properties. Besides the dominant role of surfaces and interfaces, the inter-particle bonds become stronger as the particle size is reduced. In many cases, these bonds create a nanostructure (e.g., a crystal structure) or cluster of nanoparticles bound together. Different types of inter-particle bonds have different bonding strengths.

These nanoparticle bonds can be divided into classes of bond types. The importance of weak bonds increases with the increasing size of the aggregates constructed. For stronger bonds, the differentiation of bond types is based on the parallel existence of interactions with a wide range of strengths and characters.

Example of Van der Waals Interactions

All shells of atoms interact with each other. When atoms approach each other, the electrons of one atom deform the distribution of the electrons of the other atom. This deformation disturbs the charge distribution in a way such that the sum of the energy of the two approaching atoms is lower than the sum of the atoms initially. This difference in energy determines the strength of the bond.

The Van der Waals bond is a weak bond. At room temperature, the bond between individual atoms can be easily thermally activated and broken. The pH of a nanoparticle solution can be modified to neutralize the bond with agitation applied through stirring, sonification, milling, and other agitation methods.

Van der Waals bonding is important in nanotechnology, because the building units are usually solids and consist of molecules instead of individual atoms. If two or more atoms are connected by strong ionic, covalent, coordinative, or metal bonds, then interactions of electron shells of these atoms with interface surfaces and molecules are in conjunction with the Van der Waals bonds.

Example of Ionic Bonds

Where there are large differences in the electro-negativities of atoms, a transfer of one or more electrons from the less to the more electronegative interacting partner is observed. The resulting bond is not determined by the bonding electrons, but by the interactions of the ions created by the electron transfer. The strength of this bond is comparable to a covalent bond; it is, therefore, a strong chemical interaction. Some examples of ionic bonds are calcium oxide, copper oxide, or titanium oxide. The ionic bond is between a metal and non-metal.

Example of Covalent Bonds

A covalent bond in chemistry is a chemical link between two atoms or ions in which the electron pairs are shared between them. A covalent bond may also be termed a molecular bond. Covalent bonds form between two non-metal atoms with identical or relatively close electronegativity values. This type of bond can also be found in other chemical species, such as radicals and macromolecules.

The electron pairs that participate in a covalent bond are called bonding pairs or shared pairs. Typically, sharing bonding pairs allows each atom to achieve a stable outer electron shell, similar to that seen in noble gas atoms.

Example of Metal Bonds

The creation of strong chemical bonds by exchange of binding electrons can also take place without asymmetric distribution of the electron density. If the exchange occurs only in one direction, a single covalent bond is created. If the exchange takes place in several spatial directions and is further combined with a high mobility of the binding electrons, a metal bond is created.

Through the simultaneous existence of bonds in various spatial directions, the metal bond is present in a three-dimensional network of equal bonds. Clusters are created where a limited number of atoms are involved. For large numbers of atoms, an extended binding network leads to a three-dimensional solid.

The metal bond is of special interest in micro-technology and nano-technology due to the broad application of metals and semiconductors as electrical or electronic materials. Additionally, metal bonds facilitate adhesion and provide both electrical and thermal conductivity at interfaces between different metals and inside alloys.

Completeness or discontinuity of metal bonds in the range of molecular dimensions inside ultrathin systems determines the nano-technological functions. Items such as tunneling barriers realized by local limitations of the electron mobility or the arrangement of ultrathin magnetic layers for magneto-resistive sensors lead to a change in magnetic properties at constant electrical conductivity.

Example of Hydrogen Bridge Bonds

The hydrogen bond is a specific case of a polar covalent interaction. It is based on hydrogen atoms, which create interactions between two atoms of strong electro-negative elements. In this way, one of the atoms is strongly bound as a covalent binding partner, and the second significantly weaker.

A classic case of hydrogen bonds occurs in water, where they are responsible for the disproportionately high transition points of water. The individual hydrogen bond is of relatively low energy, distributing only a weak contribution to the overall energy. In addition, it is easily cleaved. However, several hydrogen bonds between two molecules can stabilize the created aggregate significantly by inducing a cooperative binding.

Hydrogen bonds lead to less specific adsorption processes; therefore, they belong to the class of bonds responsible for disturbances at surface modifications or on layer deposition. In contrast to Van der Waals bonds and dipole-dipole interactions, hydrogen bonds are localized and oriented. They contribute significantly to specific interactions. In this respect, they are similar to coordinative bonds. Therefore, hydrogen bonds play an important role in both the supra-molecular chemistry and the super-molecular synthesis of biomolecule.

Heat and sintering agglomeration require relatively high temperatures that are used to develop a melt layer on the particle surface. As with the other agglomeration mechanisms, wetting now becomes the driver for particle agglomeration, which becomes rigid upon cooling. This type of agglomeration is often called sintering, and it can occur well below the bulk material melt temperature. As a rule of thumb, surface wetting of a heated particle can occur at temperatures as low as $2/3$ the bulk material melt temperature. Sintering may also arise if solid bridges are formed at particle contacts, as may occur with sublimation, crystallization, or solute deposition.

Temperature also should be considered. Higher temperature can make the particles sticky before they melt (the surface is already melted). Lowering the temperature even slightly could have positive results.

In the example embodiment described below calcium copper titanate (CCTO) is used as an example nanoparticle material that has nanoparticle grouping because of Van der Waals forces and ionic bonding. Any oxide nanoparticles could have the same grouping when synthesizing nanoparticles resulting in larger particle agglomerates.

Example of a Calcination Process

The process of calcination (by heat treatment) can be used to purify a chemical composition and form an oxidized network of the chemical constituents. Calcination is typically carried out in a furnace or reactor of various designs including shaft furnaces, box furnaces, microwave ovens, and other designs.

The process of calcination for CCTO nanoparticles includes the following:

During the calcination process for nanocompounds such as calcium copper titanate oxide, a nanocrystal, the individual chemical constituents of calcium, copper and titanate merge and oxidize to form calcium copper titanate oxide (CCTO). Contaminants are burned off in the early stages of the calcination process. For example, to calcine a calcium copper titanate Sol-Gel, the dried Sol-Gel would be heated to around 500° C. to burn off any contaminants and then raise the temperature to around 800° C. to oxidize and form the calcium copper titanate oxidized network.

The melting point of each of these chemicals are provided below:

| | |
|---|---|
| Calcium | 1,548° F. (842° C.) |
| Copper | 1,984° F. (1,085° C.) |
| Titanate | 3,034° F. (1,668° C.) |

The calcination temperature to form CCTO from the chemical constituents is ~800° C. With the melting point of calcium of 847° C., the calcium on the surface of the newly formed nanoparticle becomes tacky. Interfacial (interface) contact between particles can become hard interconnections as the particles cool. This creates a "neck" (interconnection) between the particles that form an aggregate.

This interconnection between the particles, for example, probably begins as a Van der Waals attraction and the interfacial (interface) contact between the particles could create one or more of the following: an oxygen to oxygen ionic bond between the particles, a metal to oxygen (e.g., calcium to oxygen) bond between the particles, or a metal to metal interconnection bond, such as between two calcium particles. The result is an aggregated nanoparticle cluster that has a hard interconnection between the nanoparticles.

To free up the aggregated nanoparticles such as to create primary particles, according to various embodiments, a fabrication method breaks up the neck (interconnection) that holds the nanoparticles together.

Several techniques in a fabrication method, when combined, can break apart the interconnection of these aggregated particles that may have been formed during calcination heat treatment, according to one example embodiment of a fabrication method discussed below.

Calcining (by applying calcination heat treatment to) the nanoparticle materials at a temperature range that is approximately 50° C. or more according to the lowest melting point of the constituents that comprise the nanoparticle material;

Subjecting the calcined and agglomerated nanoparticles to agitation in an acid bath to dissolve nanoparticle interconnections;

Washing the nanoparticles to remove the acid residue; and

Milling the nanoparticles with a surfactant to coat the nanoparticles including primary particles, and ensure continued nanoparticle separation.

The acid bath is comprised of a liquid with a pH low enough to dissolve the particle interconnections and can be comprised of pH-adjusted ethanol or distilled water where an acid is added. An example acid in this case would be acetic acid to dissolve the calcium interconnection between the nanoparticles.

The agitation can be performed by a wide variety of processes including, but not limited to, ball milling, bead milling, sonification, or jet microfluidics.

The agitated nanoparticles may have their interconnection(s) broken to create, for example, one or more primary particles, individual nanoparticles, or nanoparticle clusters (e.g., of 50 individual nanoparticles or less).

As descried above, an example nanoparticle is CCTO, which is a perovskite material.

The nanoparticles broken apart may be included in a matrix material. The matrix material may be composed of nanoparticles with reduced agglomeration (e.g., primary nanoparticles) which may be embedded in another material.

A matrix using perovskite nanoparticles can be formed in this manner. An example material for the matrix is $SiO_2$.

The matrix material can be applied as one or more of a capacitor device, an energy storage device, or a photovoltaic energy generation device, and which can be used to form a wide variety of devices.

FIG. 1 shows an example Transmission Electron Microscopy image of aggregated perovskite (CCTO) particles (101) with individual particles (102) interconnected.

Figure 2:
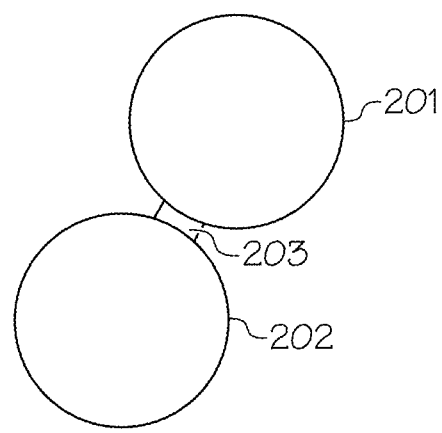
FIG. 2 is a diagram illustrating an example of an interconnection between two agglomerated nanoparticles, between two aggregated primary nanoparticles, or between an agglomerated nanoparticle and a primary nanoparticle.

FIG. 2 illustrates an example of two nanoparticles that have a hard neck interconnecting the two nanoparticles (201 and 202). The neck (203) forms from a soft chemical on the outer surface of the two nanoparticles and sticks between the two nanoparticles (201 and 202) and hardens when cooled. This neck (interconnection) (203) is formed during calcination (heat treatment) of chemicals to form a compound.

Figure 3:
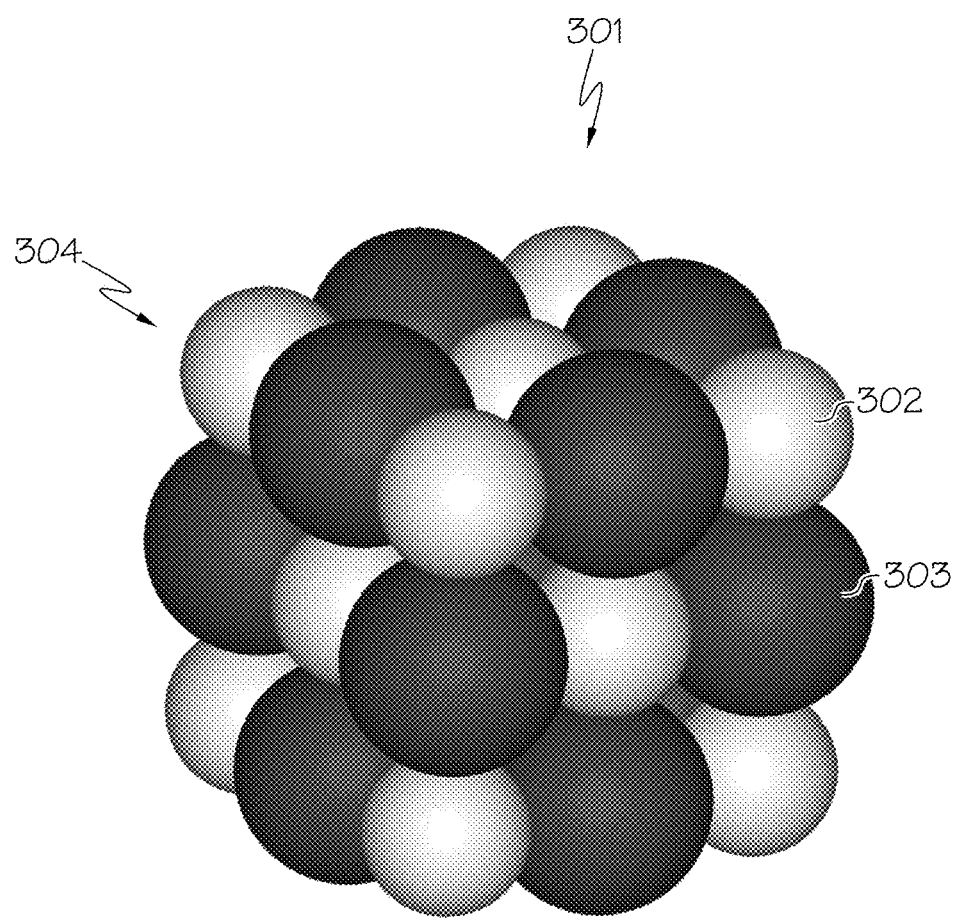
FIG. 3 is a diagram illustrating an example of a Transmission Electron Microscopy (TEM) image of perovskite (calcium copper titanium oxide or CCTO) particles and oxide particles embedded in a matrix or network.

FIG. 3 shows an example Transmission Electron Microscopy (TEM) image (301) of perovskite (CCTO) nanoparticles (302) and oxide nanoparticles (303) embedded in a matrix or network ($SiO_2$) (304). The CCTO nanoparticles (302) are separated using an acid to dissolve the calcium interconnection between the nanoparticles and thereby form individual CCTO particles (e.g., primary particles).

Figure 4:
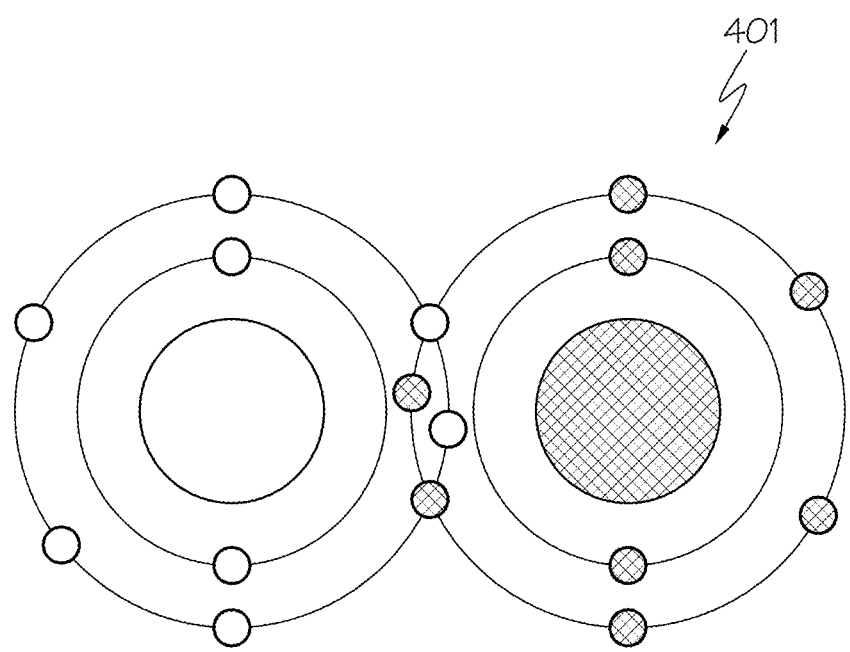
FIG. 4 is a diagram illustrating an example of ionic bonding of oxygen atoms.

FIG. 4 illustrates an example of ionic bonding of oxygen atoms.

Figure 5:
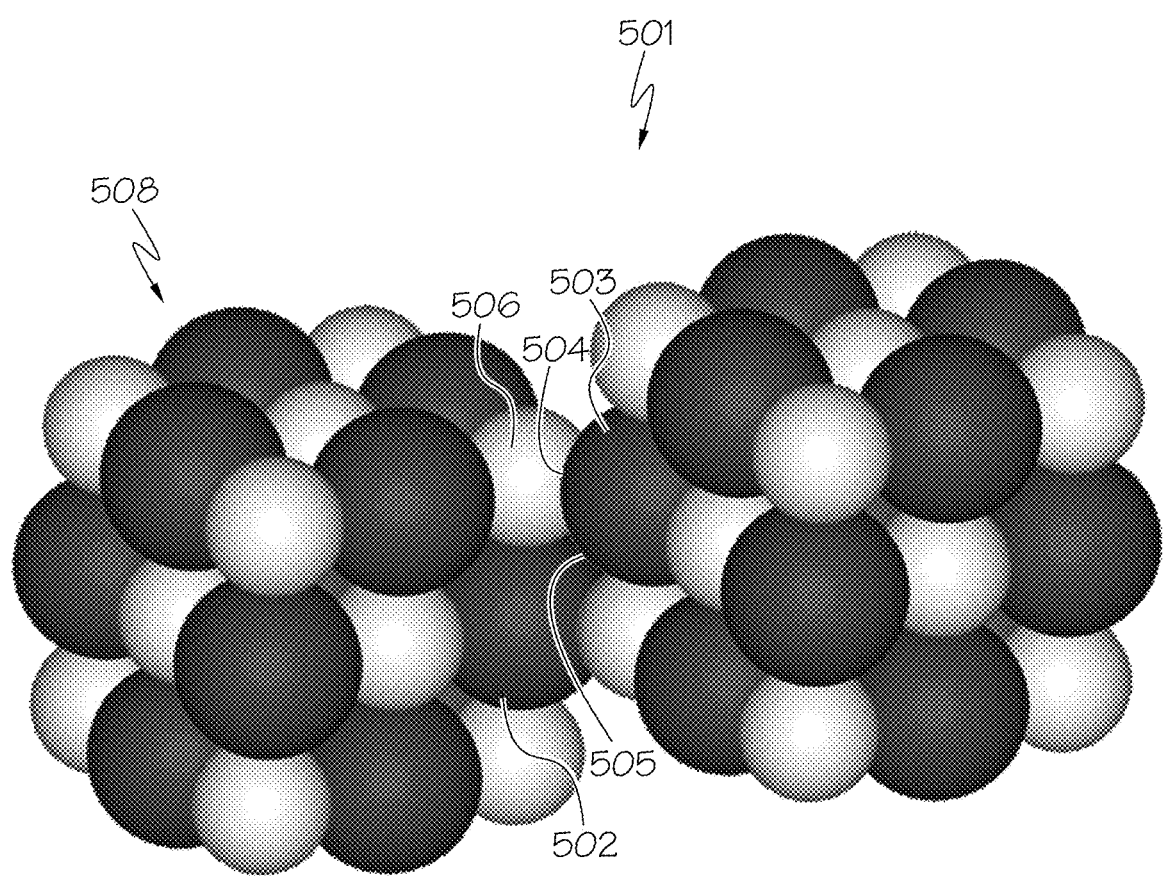
FIG. 5 is a diagram illustrating an example of particle-to-particle bonding interfaces in a matrix or network.

FIG. 5 illustrates an example of a nanoparticle to nanoparticle bonding interface (504) between an oxide nanoparticle (503) and a perovskite (CCTO) nanoparticle (506), and a nanoparticle to nanoparticle bonding interface (505) between two oxide nanoparticles (502 and 503), all in a matrix or network ($SiO_2$) (508).

Figure 6:
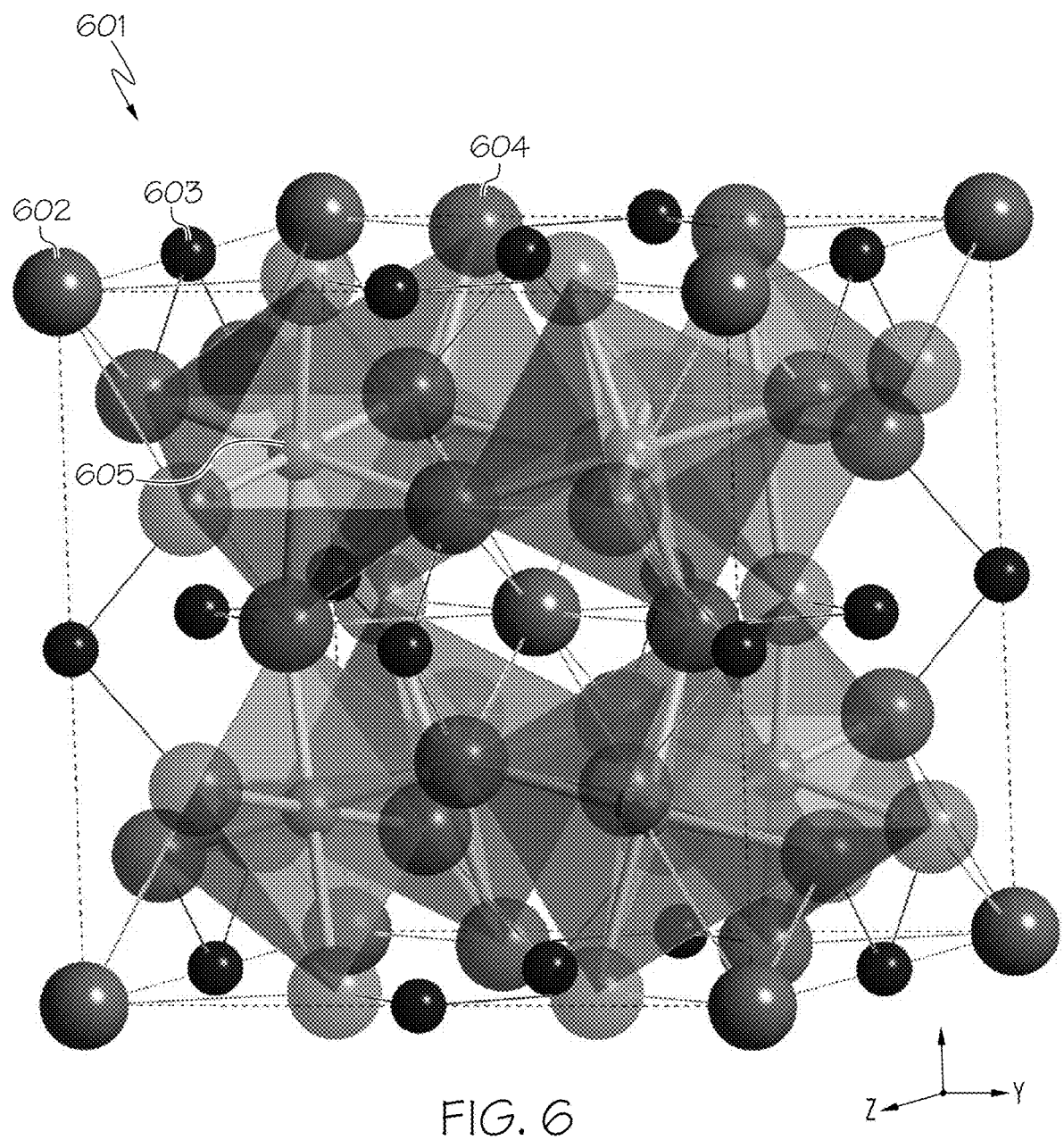
FIG. 6 is a diagram illustrating an example of a CCTO crystal structure.

FIG. 6 illustrates an example CCTO crystal structure (601) including calcium (602), copper (603), titanium (605), and oxygen (604).

Figure 7:
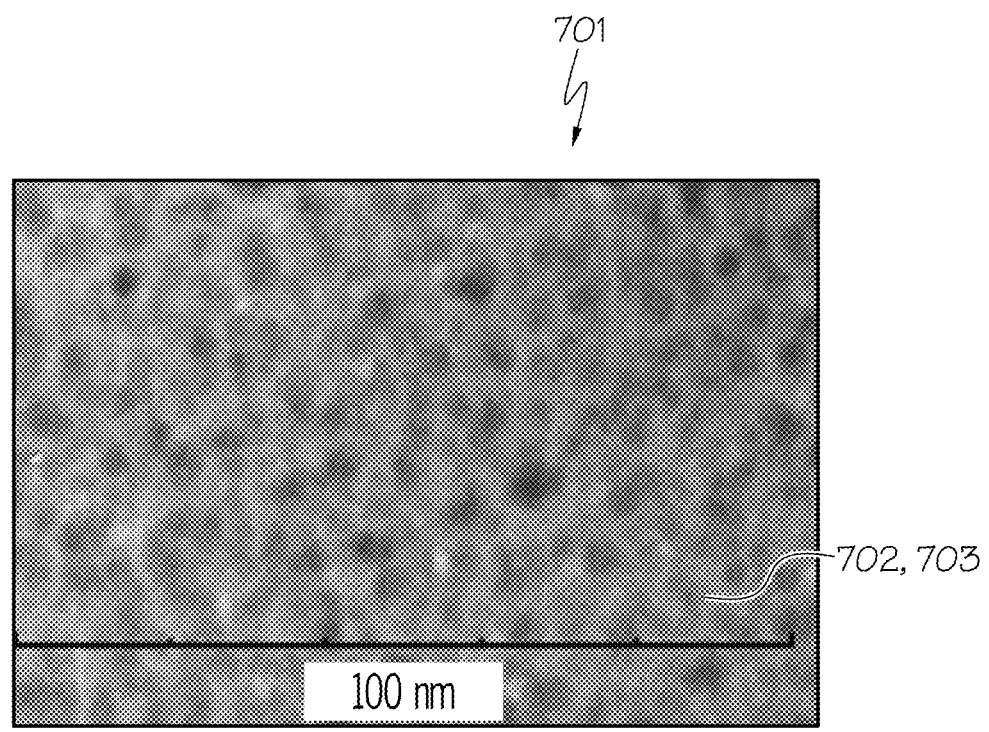
FIG. 7 is a diagram illustrating an example of a TEM image of a CCTO crystal structure showing CCTO particles reduced to primary nanoparticles in a matrix, according to an embodiment of the present invention.

FIG. 7 illustrates an example of a CCTO crystal structure (701) with CCTO particles that have been reduced to primary particles (702) in a $SiO_2$ matrix (703).

Figure 8:
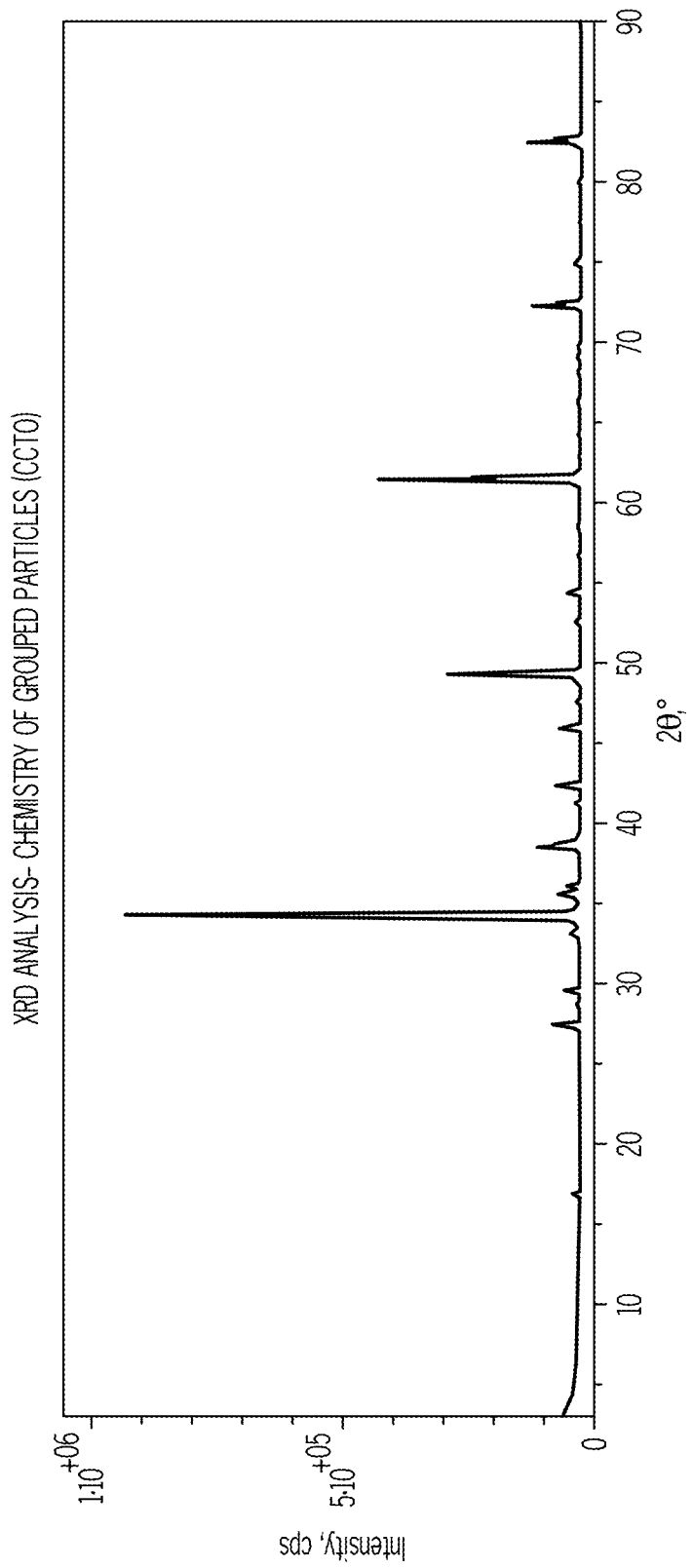
FIG. 8 is a diagram illustrating an X-Ray Diffraction (XRD) analysis of an example of CCTO material including agglomerated nanoparticles, and showing a 98% purity of CCTO crystalline phase.

FIG. 8 shows an X-Ray Diffraction analysis performed on CCTO particle agglomerates and illustrates a 98% purity of CCTO crystalline phase.

Figure 9:
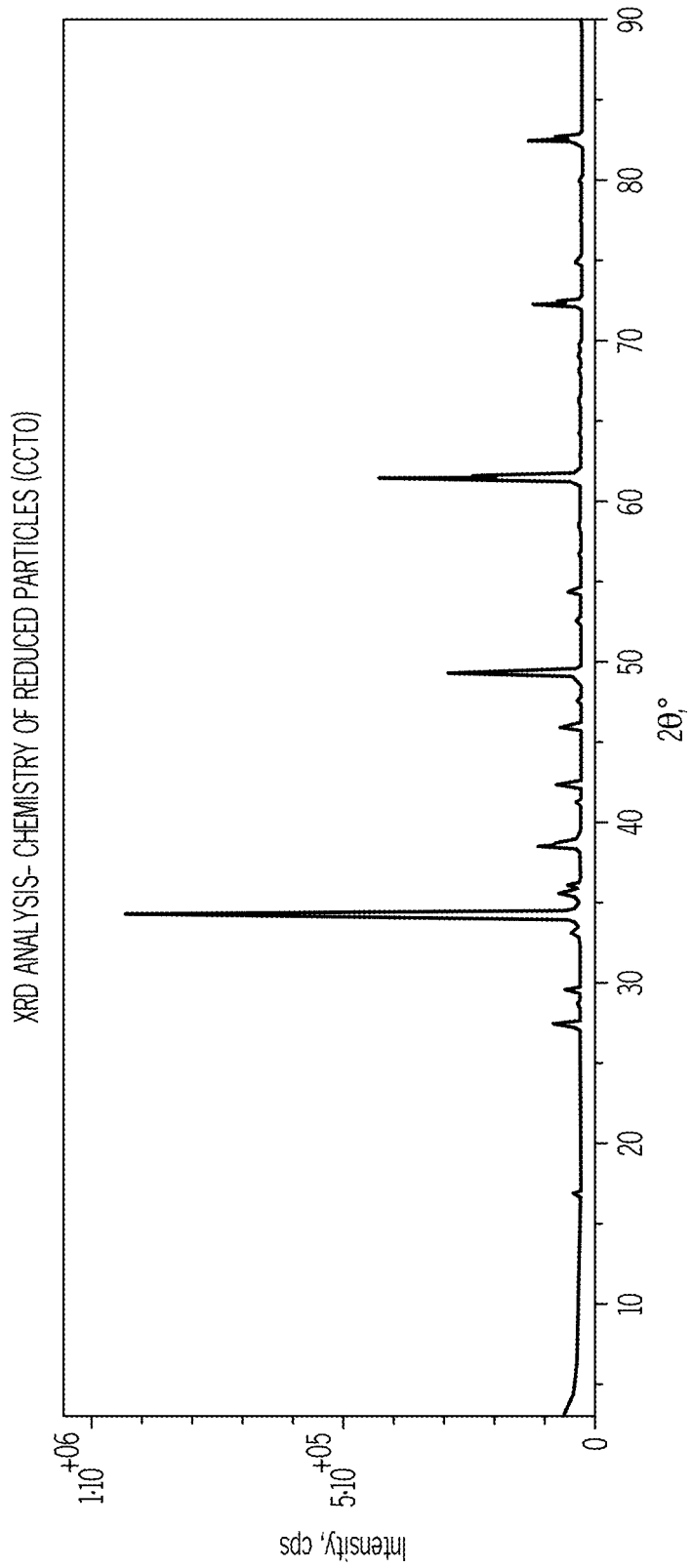
FIG. 9 is a diagram illustrating an XRD analysis of the same example of CCTO material as illustrated in FIG. 8, but has undergone nanoparticle size reduction processes as discussed herein, and showing a 98% purity of CCTO crystalline phase the same as shown for the CCTO material in FIG. 8.

FIG. 9 shows the same CCTO material as illustrated in FIG. 8 that has undergone the nanoparticle reduction processes as discussed herein. As shown in the example of FIG. 9, the CCTO particle agglomerates were subjected to an acid bath (a dissolving pH solution) of pH 4.0 for 30 minutes to break ionic bonds between the nanoparticles formed after Van der Waals forces grouped the nanoparticles together under a heated state. Once the ionic bonds were broken down, the nanoparticles re-agglomerated under Van der Waals forces. The nanoparticle agglomerates were then placed in a pH matching solution of 10 that is close to (e.g., can be adjusted to match) the iso-electric point of the nanoparticles. A surfactant was added to the solution and the solution was sonicated to break up the CCTO agglomerated nanoparticles, and coat individual nanoparticles (e.g., primary nanoparticles) with the surfactant to avoid re-agglomeration. The XRD Diffraction analysis in FIG. 9 shows that the CCTO material composed of a large percentage (e.g., at least 75% or higher percentage) of primary nanoparticles in the respective CCTO material, is still at a 98% purity. According to various embodiments, the CCTO material may be composed of at least 95% or higher percentage of primary nanoparticles in the respective CCTO material. According to various embodiments, the CCTO material may be composed of at least 99% or higher percentage of primary nanoparticles in the respective CCTO material. Additionally, while the example discussed with reference to FIG. 9 used a dissolving pH solution of pH 4.0 for 30 minutes, the inventor discovered that a dissolving PH solution suitable for use in various embodiments of the invention could have a pH in the range from −2.0 pH to 12.0 pH.

The features and advantages described in the specification are not all inclusive, and particularly, many additional features and advantages will be apparent to one of ordinary skill in the art in view of the description, specification and claims hereof.

Moreover, it should be noted that the language used in the specification has been principally selected for readability and instructional purposes, and may not have been selected to delineate or circumscribe the inventive subject matter, resort to the claims being necessary to determine such inventive subject matter. Although specific embodiments of the subject matter have been disclosed herein, those having ordinary skill in the art will understand that changes can be made to the specific embodiments without departing from the scope of the disclosed subject matter. The scope of the disclosure is not to be restricted, therefore, to the specific embodiments, and it is intended that the appended claims cover any and all such applications, modifications, and embodiments within the scope of the present disclosure.

Summary of Various Non-Limiting Example Embodiments

One example, according to various embodiments of the present invention, includes a modified internal barrier layer capacitor material comprising:

a base material comprising unmodified internal barrier capacitor material having grain boundaries;

first and second resistive materials bonded to the grain boundaries of the base material to form modified grain boundaries of the base material, wherein the first resistive material is bonded to grain boundaries of the base unmodified internal barrier capacitor material forming a grain boundary composition which includes nanoparticles of the first resistive material added to nanoparticles of the unmodified internal barrier capacitor material, and wherein the second resistive material is bonded to grain boundaries of the grain boundary composition forming a modified internal barrier layer capacitor material which includes nanoparticles of the second resistive material added to nanoparticles of the grain boundary composition; and an amorphous region in between the grain boundaries of the modified internal barrier layer capacitor material, the amorphous region including nanoparticles of the at least one of the first and second resistive materials, wherein at least one of the base material, the first resistive material, or the second resistive material, comprises at least 75% or higher percentage of primary nanoparticles in the respective at least one of the base material, the first resistive material, or the second resistive material.

When applied in a matrix, the above modified internal barrier layer capacitor materials are isolated from one another in the matrix. Various embodiments of the present fabrication method enable reduction of nanoparticle sizes of one or more nanoparticle groupings in material (when measured in a critical dimension of the nanoparticle or nanoparticle cluster) that are less than or equal to 500 nm, less than or equal to 100 nm, less than or equal to 50 nm, less than or equal to 20 nm, or less than or equal to 10 nm, depending on the application of the novel fabrication method discussed herein for reduction of size of nanoparticle grouping (e.g., including one or more agglomerated nanoparticles and/or aggregated nanoparticles) in a material, depending on a chemistry of the material, and depending on calcination temperatures applied to the material, before the nanoparticles are encased in the matrix.

In one example, according to various embodiments, the modified internal barrier layer capacitor material includes two phases of Calcium Copper Titanium oxides: Calcium Copper Titanate (CCTO): $CaCu_3Ti_4O_{12}$ and Calcium Tricopper Tetratita (CTT): $CaCu_3O_{12}Ti_{14}$ resulting in a two phase internal barrier layer capacitor material, a first resistive material is applied to the grain boundaries of both internal barrier layer materials thereby resulting in a grain boundary composition on each; and a second resistive material is bonded to the grain boundary composition of each internal barrier layer material thereby resulting in the modified dual phase internal barrier layer capacitor material, wherein at least one of the base material, the first resistive material, or the second resistive material, comprises at least 75% or higher percentage of primary nanoparticles in the respective at least one of the base material, the first resistive material, or the second resistive material.

In another example, according to various embodiments, the modified internal barrier layer capacitor material is comprised of ultra-thin grains that measure less than 50 nm in diameter (or that measure less than 50 nm in a critical dimension of the nanoparticle) which are hereby known as Dielectrum particles.

When distributed in a matrix, these Dielectrum particles provide increased resistivity, permittivity, and breakdown voltage, compared to other dielectric particles in a matrix.

In another example, according to various embodiments, the modified internal barrier layer capacitor material includes the unmodified internal barrier layer capacitor material which is based on Calcium Copper Titanate (CCTO);

the first resistive material is Aluminum Oxide ($Al_2O_3$) resulting in $CCTO/CuAl_2O_4$ as the grain boundary composition; and the second resistive material is Silicon Dioxide ($SiO_2$) resulting in $CCTO/CuAl_2SiO_6$ as the modified internal barrier layer capacitor material.

After calcination and or sintering of the modified internal barrier layer capacitor material there may be other phases that are include such as, but not limited to, rutile ($TiO_2$), walstromite ($CaSiO_3$), corundum ($Al_2O_3$), tenorite (CuO), copper aluminum oxide ($CuAl_2O_4$), and silicon oxide ($SiO_2$). At least one of the base material, the first resistive material, or the second resistive material, comprises, according to various embodiments, at least 75% or higher percentage of primary nanoparticles.

In one example, according to various embodiments, the additional Silicon Dioxide results in the matrix for suspension of the modified internal barrier layer capacitor material.

In another example of the modified internal barrier layer capacitor material, according to various embodiments, an unmodified internal barrier layer capacitor material is based on Calcium Copper Titanate (CCTO);

the first resistive material is 2% to 15% wt Aluminum Oxide ($Al_2O_3$) resulting in $CCTO/CuAl_2O_4$ as the grain boundary composition; and the second resistive material is 10% to 30% wt Silicon Dioxide ($SiO_2$) resulting in $CCTO/CuAl_2SiO_6$ as the modified internal barrier layer capacitor material, wherein at least one of the base material, the first resistive material, or the second resistive material, comprises at least 75% or higher percentage of primary nanoparticles in the respective at least one of the base material, the first resistive material, or the second resistive material.

Another example includes, according to various embodiments, modified internal barrier layer capacitor material where the unmodified internal barrier layer capacitor material (base material) is a modified stoichiometry of Calcium Copper Titanium Oxide (CCTO-XS), the first resistive material is Aluminum Oxide ($Al_2O_3$), and the second resistive material is Silicon Dioxide ($SiO_2$), and wherein at least one of the base material, the first resistive material, or the second resistive material, comprises at least 75% or higher percentage of primary nanoparticles in the respective at least one of the base material, the first resistive material, or the second resistive material.

Another example includes, according to various embodiments, modified internal barrier layer capacitor (IBLC) material wherein the internal barrier layer capacitor grain growth, when sintering, is inhibited by the depletion of a portion of the copper, titanium, and calcium from the grain boundary resulting from secondary phases of $CuAl_2O_4$, TiSiO and CaSiO, and wherein at least one of the base material, the first resistive material, or the second resistive material, comprises at least 75% or higher percentage of primary nanoparticles in the respective at least one of the base material, the first resistive material, or the second resistive material.

Another example includes, according to various embodiments, modified internal barrier layer capacitor (IBLC) material wherein the primary IBLC grain growth is a result of calcination temperatures and dwell times during CCTO calcination and during the addition of the first resistive oxide through the second calcination, and wherein at least one of the base material, the first resistive material, or the second resistive material, comprises at least 75% or higher percentage of primary nanoparticles in the respective at least one of the base material, the first resistive material, or the second resistive material.

An energy storage device based on a multilayer ceramic capacitor device as described in the examples discussed herein can be described as a Dense Energy Ultra-Cell Element (DEUC Element). The DEUC Element is a building block used to create, according to various embodiments, one or more of the following:

A DEUC Cell where one or more DEUC Elements are connected in series and/or in parallel circuit(s) to form a DEUC Cell, and A DEUC Module where one or more DEUC Cells are combined and interconnected in series and/or in parallel circuit(s) to form a DEUC Module, and DEUC Module Array where one or more DEUC Modules are combined and interconnected in series and/or parallel circuit(s) to form a DEUC Module Array.

The DEUC Element, DEUC Cell, DEUC Module and DEUC Module Array, according to various embodiments, can be applied to store and provide electrical power to at least one of: micro devices and integrated circuits, electric vehicles, aircraft, boats, ships, unmanned aerial, terrestrial or water vehicles, electronic cigarettes, mobile computing devices, laptops, tablets, mobile phones, wireless communication devices, and mobile sensor systems, energy storage for an electric power grid, power backup, energy storage for solar, wind, and other alternative energy generation systems, and uninterruptible power supplies.

What is claimed is:

1. A method of fabrication of material that includes reduced size of nanoparticle grouping, the method comprises:

subjecting one or more calcine heated nanoparticle groupings to a dissolving pH solution, where the pH of the dissolving pH solution is adjusted to dissolve nanoparticle interconnections at interfaces of a plurality of nanoparticles in the one or more nanoparticle groupings;

agitation of the plurality of nanoparticles in the dissolving pH solution;

separating the plurality of nanoparticles from the dissolving pH solution;

placing the plurality of nanoparticles in a pH matching solution, where a pH of the pH matching solution is adjusted to match an iso-electric point of the plurality of nanoparticles;

adding a surfactant to the pH matching solution with the plurality of nanoparticles to separate the plurality of nanoparticles, coat with the surfactant the separated plurality of nanoparticles, and maintain nanoparticle separation in the separated plurality of nanoparticles; and agitation of the plurality of nanoparticles and surfactant in the pH matching solution to yield at least one of clustered nanoparticles or primary nanoparticles; and forming a matrix composed of one or more of the clustered nanoparticles or primary nanoparticles of calcium copper titanate (CCTO) that are embedded in $SiO_2$.

2. The method of fabrication of claim 1, wherein at least one nanoparticle grouping comprises one or more of an agglomerate, an aggregate, or a cluster of nanoparticles.

3. The method of fabrication of claim 1, wherein the dissolving pH solution comprises a liquid with a pH of from −2.0 to 12.0 to dissolve the nanoparticle interconnections.

4. The method of fabrication of claim 1, wherein the dissolving pH solution comprises ethanol with a pH of from −2.0 to 12.0 to dissolve the nanoparticle interconnections.

5. The method of fabrication of claim 1, wherein the dissolving pH solution comprises distilled water with a pH of from −2.0 to 12.0 to dissolve the nanoparticle interconnections.

6. The method of fabrication of claim 1, wherein the dissolving pH solution is comprised of a liquid with a pH of between −2.0 to 12.0 to dissolve the nanoparticle interconnections and a surfactant to coat the separated plurality of nanoparticles.

7. The method of fabrication of claim 1, wherein the agitation is performed by at least one of stirring, ball milling, bead milling, sonification, or jet microfluidics.

8. The method of fabrication of claim 1, wherein a heated surface of one or more of the calcine heated nanoparticle groupings becomes soft and forms a hard interconnection between the plurality of nanoparticles in the one or more calcine heated nanoparticle groupings at an interfacial contact of the plurality of nanoparticles when cooled.

9. The method of fabrication of claim 1, wherein the one or more calcine heated nanoparticle groupings includes one or more agglomerated nanoparticles and/or aggregated nanoparticles, formed as a Van der Waals formation of nanoparticles.

10. The method of fabrication of claim 1, wherein the one or more calcine heated nanoparticle groupings includes one or more agglomerated nanoparticles and/or aggregated nanoparticles, formed as one or more of:

an ionic bond between oxygen atoms of adjacent nanoparticles; or a covalent bond between metal and non-metal atoms of adjacent nanoparticles.

11. The method of fabrication of claim 1, wherein the one or more calcine heated nanoparticle groupings includes one or more agglomerated nanoparticles and/or aggregated nanoparticles, formed as a metallic bond between atoms of adjacent nanoparticles.

12. The method of fabrication of claim 1, wherein one of the one or more calcine heated nanoparticle groupings is reduced to primary nanoparticles.

13. The method of fabrication of claim 1, wherein an agglomeration of nanoparticles is reduced to nanoparticle clusters of ten individual nanoparticles or less.

14. The method of fabrication of claim 1, wherein the plurality of nanoparticles includes at least one primary nanoparticle that comprises perovskite material.

15. The method of fabrication of claim 1, wherein the plurality of nanoparticles includes perovskite materials applied in a dielectric energy storage material.

16. The method of fabrication of claim 1, wherein a matrix is composed of reduced one or more nanoparticle groupings that are embedded in another material.

* * * * *